United States Patent [19]
Deluigi et al.

[11] Patent Number: 6,163,185
[45] Date of Patent: Dec. 19, 2000

[54] PHASE FREQUENCY DETECTOR HAVING INSTANTANEOUS PHASE DIFFERENCE OUTPUT

[75] Inventors: Bruno J. Deluigi, Meisterschwanden; Matthias Locher, Zürich, both of Switzerland

[73] Assignee: U.S. Philips Corporation, New York, N.Y.

[21] Appl. No.: 09/304,597

[22] Filed: May 4, 1999

[30] Foreign Application Priority Data

May 4, 1998 [EP] European Pat. Off. .............. 98201437

[51] Int. Cl.$^7$ ...................................... H03L 7/06
[52] U.S. Cl. ................................. 327/156; 327/7
[58] Field of Search ................... 327/2, 5, 7, 8, 327/10, 12, 147–150, 155–159, 163; 331/17; 375/373–376

[56] References Cited

U.S. PATENT DOCUMENTS

| | | | |
|---|---|---|---|
| 4,801,894 | 1/1989 | Garner ..................................... | 331/1 A |
| 5,121,010 | 6/1992 | Hoshizaki et al. ...................... | 307/528 |
| 5,949,264 | 9/1999 | Lo .......................................... | 327/157 |
| 6,002,273 | 12/1999 | Humphreys ............................ | 327/3 |
| 6,040,742 | 3/2000 | Bailey et al. ........................... | 331/2 |

OTHER PUBLICATIONS

By Roland E. Best "Phase–Locked Loops" McGraw –Hill 1993, pp. 93–95.

*Primary Examiner*—My-Trang Nuton

[57] ABSTRACT

A phase frequency detector comprises means for providing Up/Down signals in order to detect a phase difference between detector input signals, and output control means having Up/Down signal inputs for providing a detector output signal containing a measure which is proportional to said detected phase difference, and having capacitor means for providing the detector output signal whose measure depends instantaneously on said detected phase difference.

This allows a loop filter which is present in a phase locked loop to have reduced averaging properties and to have a broader bandwidth resulting in a cleaner output frequency signal of a voltage controlled oscillator in the phase locked loop.

12 Claims, 1 Drawing Sheet

PHASE FREQUENCY DETECTOR HAVING INSTANTANEOUS PHASE DIFFERENCE OUTPUT

BACKGROUND OF THE INVENTION

1. Field of the Invention

The present invention relates to a phase frequency detector comprising means for providing Up/Down signals in order to detect a phase difference between detector input signals, and output control means having Up/Down signal inputs for providing a detector output signal containing a measure which is proportional to said detected phase difference.

The present invention also relates to a phase locked loop provided with a phase frequency detector and to a communication device provided with a phase frequency detector.

2. Description of the Related Art

Such a phase frequency detector is generally known and is applied in a phase locked loop (PLL), such as described in a McGraw-Hill, Inc. textbook entitled "Phase-Locked Loops" (see FIGS. 3.1 and 3.2). The known phase locked loop comprises a phase frequency detector having two oscillator inputs, a voltage controlled oscillator, and a loop filter interconnecting the detector output and a frequency control input of the voltage controlled oscillator. The oscillator output signal is fed back to the one of the oscillator inputs of the phase frequency detector, whereas its other oscillator input receives another oscillator signal, such as a local oscillator signal from for example a stabile clock oscillator, whereon the PLL locks. The phase frequency detector uses pulse width modulated Up/Down signals to control through a series arrangement of semiconductors the detector output signal, which output signal contains a measure, which is proportional to a detected phase difference between the two oscillator input signals of the detector. Disadvantage of the known phase frequency detector is that its output signal contains a relatively large amount of harmonics requiring averaging by means of the loop filter having a large time constant. However a large time constant reduces the bandwidth and therewith the properties of the PLL to provide a clean, side band frequency reduced and spectral pure VCO signal.

SUMMARY OF THE INVENTION

It is an object of the present invention to present an improved easy to integrate phase frequency detector providing improved cleaning properties to the PLL, while at the same time the loop filter can be given an increased bandwidth.

Thereto the phase frequency detector according to the invention is characterised in that the output control means comprises capacitor means for providing the detector output signal whose measure depends instantaneously on said detected phase difference. It is an advantage of the phase frequency detector according to the present invention that it allows the loop filter requirements to be at least alleviated, because the detector output signal is momentarily/instantaneously proportional to the detected phase difference instead of being controlled by an averaged signal as is required by the prior art loop filter. Without the need to create the instantaneously phase difference dependent detector output signal by means of an averaging process, the loop filter can be optimised for an efficient cleanup of the VCO signal, while the loop filter can now be given an increased bandwidth. Optimising the loop filter also optimises the stability of the loop, its lock-in behaviour, as well as the length of the settling time prior to lock-in.

A simple and easy to implement embodiment of the phase frequency detector according to the invention is characterised in that the capacitor means comprises at least one capacitor whose voltage is proportional to said detected phase difference.

A further embodiment of the phase frequency detector according to the invention is characterised in that the output control means comprises switched capacitor means for switching the detector output to the capacitor means. The switching of the capacitor voltages of the generally two capacitors to the detector output yields a stepped detector output signal which is updated once or more every period. The stepped signal voltage is proportional to the instant value of the phase difference between the detector input signals. In steady state the phase error is relatively small and therefore the voltage step at the detector output is also small. The result is a nearly constant detector output voltage with only a few relevant harmonics, which can be easily filtered out by the loop filter.

In a still further embodiment the phase frequency detector according to the invention is characterised in that the output control means comprises reset means for resetting the respective capacitor voltage for example after its switching to the detector output. In an embodiment having two capacitors these capacitors are either charged, switched to the detector output or their voltage is reset to zero respectively.

In a following embodiment the phase frequency detector according to the invention is characterised in that the output control means comprises Up/Down signal controlled current sources coupled to each capacitor to be charged. The advantageous effect is that during the width of the Up-Down signals each capacitor can be charged with a constant current.

BRIEF DESCRIPTION OF THE DRAWING

At present the phase frequency detector according to the invention will be elucidated further together with its additional advantages while reference is being made to the appended drawing, wherein similar components are being referred to by means of the same reference numerals. In the drawing.

DESCRIPTION OF THE PREFERRED EMBODIMENTS

Figure 1:
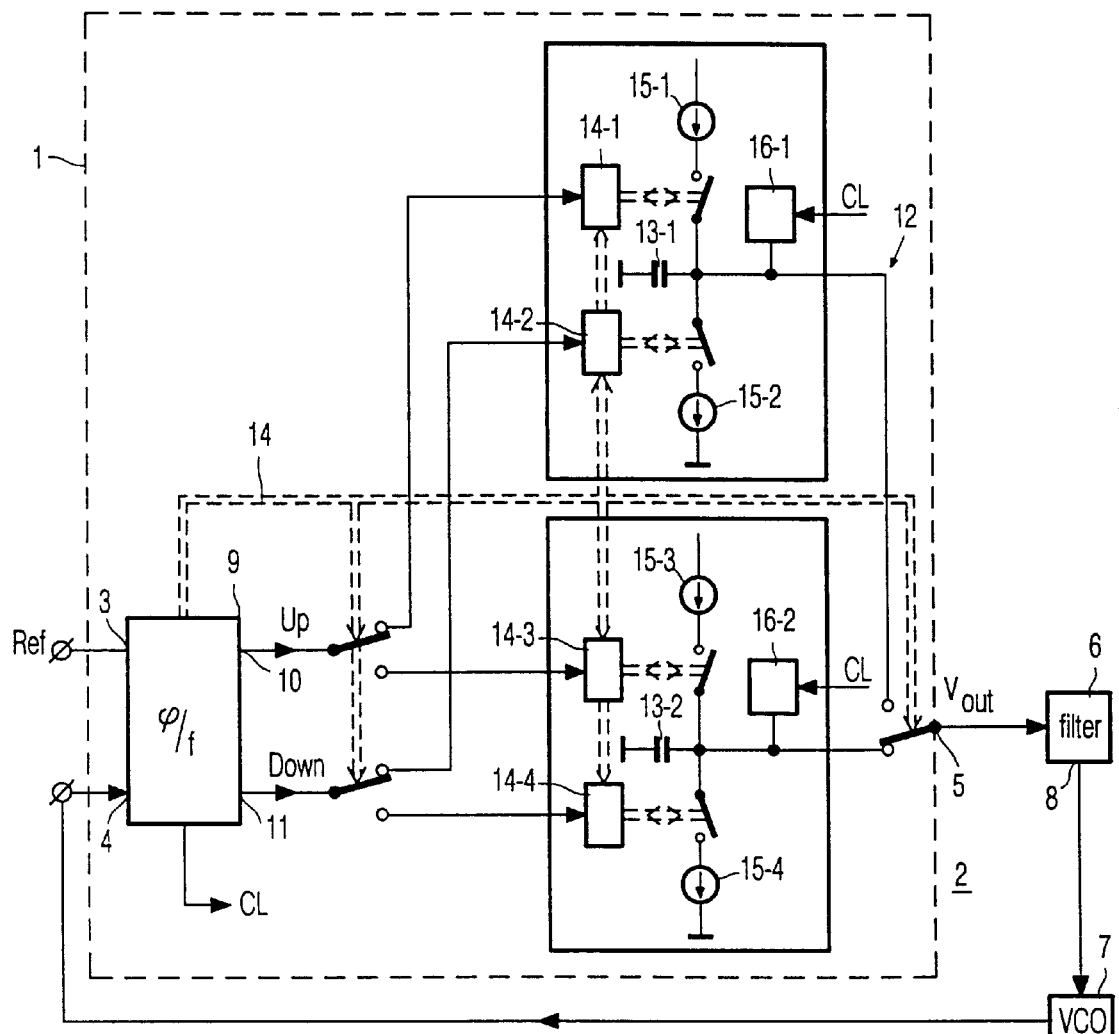
FIG. 1 shows a possible embodiment of the phase frequency detector according to the invention.

FIG. 1 shows a phase frequency detector 1 included in a phase locked loop (PLL) 2 as can be applied in a communication device such as a receiver, transmitter, transceiver, pager, telephone for example a mobile or portable telephone. Such a PLL is generally applied in those technical applications and devices where an oscillator having a stable frequency and having a strongly reduced sideband noise is required. The phase frequency detector 1 has a reference oscillator input 3, a VCO oscillator input 4 and a detector output 5. The PLL 2 further comprises a loop filter 6 connected to the detector output 5 and a in this case voltage controlled oscillator 7, which is interconnected between loop filter output 8 and the oscillator input 4 of the phase frequency detector 1. The VCO 7 outputs a stabile oscillator signal which after a settling time will be locked to the reference oscillator frequency in a way generally known to the man skilled in the art.

The phase frequency detector 1 provides an output signal on detector output 5 whose amplitude reflects the phase and/or frequency difference between the oscillator inputs 3 and 4 in a way to be described further. The phase frequency detector 1 comprises means 9 for providing Up/Down signals on Up output 10 and Down output 11 respectively. These signals contain difference information about the sign and amount of the detected phase and thus also frequency difference (being the time derivative of the phase) between the input oscillator signals. Either Up alone, or Down alone, or Up and/or Down signals may be used at wish. The difference information contained in the Up/Down signals can be in the form of pulse width modulated or for example pulsed Up/Down signals. In that case the difference information is contained in the pulse width or in the pulse rate respectively.

Figure 2:
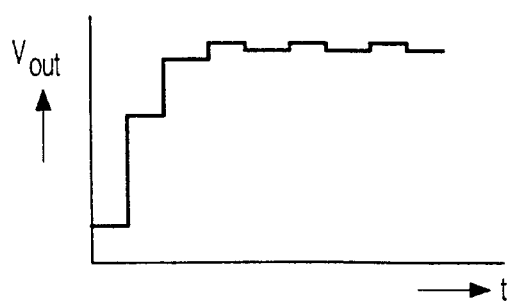
FIG. 2 exemplifies a graph of the stepped detector output voltage as a function of time in the detector of FIG. 1.

The phase frequency detector 1 comprises output control means 12 embodied with capacitor means 13, in particular two capacitors 13-1 and 13-2, whose voltage is representative for said difference information on points in time in the detection cycle. Thereto the capacitor means 13 are connected to respective switching means 14 and to respective current sources 15, as is schematically shown in FIG. 1. The Up-Down signals respectively determine by means of controlling the switching means 14, the length of time that the respective capacitors 13-1 and 13-2 are being electrically charged by means of the respective current sources 15-1 to 15-4. After its charging one capacitor 13-1 or 13-2 is switched to the detector output 5, whose voltage reflects the difference information in order to control the output frequency of the VCO 7 therewith. Meanwhile the other of the capacitors 13-1 and 13-2 can be reset by reset means 16-1, 16-2 for clearing (CL) the electrical charge hereof. Resetting initialises the phase measurement to yield an instantaneous, phase difference. Finally the detector output signal contains a measure which is stepwise instantaneous and proportional to said detected phase difference. An example of the stepped detector output voltage is shown in FIG. 2 as a function of time. In steady state conditions of the phase frequency detector 1 the steps to control the frequency of the VCO will be very small. This results in a less harmonically distorted signal on output 5, whereby the reduced harmonics present can be filtered out more easily by the loop filter 6 having reduced filter characteristics without averaging being necessary thereto. The result is a clean and less phase distorted VCO output frequency.

In view of the foregoing it will be evident to a person skilled in the art that various modifications may be made within the spirit and the scope of the present invention as hereinafter defined by the appended claims and that the present invention is thus not limited to the examples provided.

We claim:

1. A digital phase-frequency detector comprising:

detection means for detecting phase and frequency differences between a first digital signal at a first input of said digital phase-frequency detector and a second digital signal at a second input of said digital phase-frequency detector, said detection means providing an up signal if said first digital signal leads said second digital signal and a down signal if said first digital signal lags said second digital signal;

output means for providing a detector output signal that represents an instantaneous phase error between said first and second digital signals, said output means being controlled by said up and down signals, said output means comprising at least one capacitor for providing said output signal as an instantaneously detected signal, and said output means comprising a first sourcing current source and a first current sinking source, and switching means for switching said first sourcing current source to said at least one capacitor during presence of said up signal and for switching said first sinking current source to said at least one capacitor during presence of said down signal, said up signal charging said at least one capacitor and said down signal discharging said at least one capacitor.

2. A digital phase-frequency detector as claimed in claim 1, further comprising a second current sourcing source and a second current sinking source, said output means comprising two capacitors, said switching means alternatively switching said first current sourcing and sinking sources to a first capacitor of said two capacitors, and said second current sourcing and sinking sources to a second capacitor of said two capacitors, said first and second current sourcing sources alternatively being switched to said first and second capacitors during presence of said up signal, and said first and second current sinking sources alternatively being switched to said first and second capacitors during presence of said down signal, and said first and second capacitors alternatively being switched to an output of said digital phase-frequency detector, said output providing said detector output signal.

3. A digital phase-frequency detector as claimed in claim 2, wherein said output means comprises means for respectively resetting a first voltage at said first capacitor and a second voltage at said second capacitor, said first voltage being reset upon disconnecting said first capacitor from said detector output, and said second voltage being reset upon disconnecting said second capacitor from said detector output.

4. A digital phase-frequency detector as claimed in claim 1, wherein said up and down signals are pulse width modulated signals.

5. A phase locked loop circuit with a digital phase-frequency detector, said digital phase-frequency detector comprising:

detection means for detecting phase and frequency differences between a first digital signal at a first input of said digital phase-frequency detector and a second digital signal at a second input of said digital phase-frequency detector, said detection means providing an up signal if said first digital signal leads said second digital signal and a down signal if said first digital signal lags said second digital signal;

output means for providing a detector output signal that represents an instantaneous phase error between said first and second digital signals, said output means being controlled by said up and down signals, said output means comprising at least one capacitor for providing said output signal as an instantaneously detected signal, and said output means comprising a first sourcing current source and a first current sinking source, and switching means for switching said first sourcing current source to said at least one capacitor during presence of said up signal and for switching said first sinking current source to said at least one capacitor during presence of said down signal, said up signal charging said at least one capacitor and said down signal discharging said at least one capacitor.

6. A phase locked loop circuit as claimed in claim 5, said digital phase-frequency detector further comprising a second current sourcing source and a second current sinking source, said output means comprising two capacitors, said switching means alternatively switching said first current sourcing and sinking sources to a first capacitor of said two capacitors, and said second current sourcing and sinking sources to a second capacitor of said two capacitors, said first and second current sourcing sources alternatively being switched to said first and second capacitors during presence of said up signal, and said first and second current sinking sources alternatively being switched to said first and second capacitors during presence of said down signal, and said first and second capacitors alternatively being switched to an output of said digital phase-frequency detector, said output providing said detector output signal.

7. A phase locked loop circuit as claimed in claim 6, wherein said output means comprises means for respectively resetting a first voltage at said first capacitor and a second voltage at said second capacitor, said first voltage being reset upon disconnecting said first capacitor from said detector output, and said second voltage being reset upon disconnecting said second capacitor from said detector output.

8. A phase locked loop circuit as claimed in claim 5, wherein said up and down signals are pulse width modulated signals.

9. A communication device comprising a phase locked loop circuit having a digital phase-frequency detector, said digital phase-frequency detector comprising:

detection means for detecting phase and frequency differences between a first digital signal at a first input of said digital phase-frequency detector and a second digital signal at a second input of said digital phase-frequency detector, said detection means providing an up signal if said first digital signal leads said second digital signal and a down signal if said first digital signal lags said second digital signal;

output means for providing a detector output signal that represents an instantaneous phase error between said first and second digital signals, said output means being controlled by said up and down signals, said output means comprising at least one capacitor for providing said output signal as an instantaneously detected signal, and said output means comprising a first sourcing current source and a first current sinking source, and switching means for switching said first sourcing current source to said at least one capacitor during presence of said up signal and for switching said first sinking current source to said at least one capacitor during presence of said down signal, said up signal charging said at least one capacitor and said down signal discharging said at least one capacitor.

10. A communication device as claimed in claim 9, said digital phase-frequency detector further comprising a second current sourcing source and a second current sinking source, said output means comprising two capacitors, said switching means alternatively switching said first current sourcing and sinking sources to a first capacitor of said two capacitors, and said second current sourcing and sinking sources to a second capacitor of said two capacitors, said first and second current sourcing sources alternatively being switched to said first and second capacitors during presence of said up signal, and said first and second current sinking sources alternatively being switched to said first and second capacitors during presence of said down signal, and said first and second capacitors alternatively being switched to an output of said digital phase-frequency detector, said output providing said detector output signal.

11. A communication device as claimed in claim 10, wherein said output means comprises means for respectively resetting a first voltage at said first capacitor and a second voltage at said second capacitor, said first voltage being reset upon disconnecting said first capacitor from said detector output, and said second voltage being reset upon disconnecting said second capacitor from said detector output.

12. A communication device as claimed in claim 9, wherein said up and down signals are pulse width modulated signals.

\* \* \* \* \*